United States Patent
Steigerwald et al.

(10) Patent No.: US 7,095,061 B2
(45) Date of Patent: *Aug. 22, 2006

(54) CONTACTING SCHEME FOR LARGE AND SMALL AREA SEMICONDUCTOR LIGHT EMITTING FLIP CHIP DEVICES

(75) Inventors: Daniel A. Steigerwald, Cupertino, CA (US); Jerome C. Bhat, San Francisco, CA (US); Michael J. Ludowise, San Jose, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/961,239

(22) Filed: Oct. 7, 2004

(65) Prior Publication Data

US 2005/0067624 A1    Mar. 31, 2005

Related U.S. Application Data

(63) Continuation of application No. 10/172,311, filed on Jun. 13, 2002, now Pat. No. 6,828,596.

(51) Int. Cl.
*H01L 33/00* (2006.01)

(52) U.S. Cl. .......................................... 257/99; 257/774
(58) Field of Classification Search .................. 257/99, 257/774

See application file for complete search history.

(56) References Cited

U.S. PATENT DOCUMENTS 5,696,389 A    12/1997    Ishikawa et al.
5,886,401 A    3/1999     Liu
5,898,185 A    4/1999     Bojarczuk, Jr. et al.
5,998,232 A    12/1999    Maruska
RE36,747 E     6/2000     Manabe et al.
6,274,924 B1   8/2001     Carey et al.
6,278,136 B1   8/2001     Nitta
6,518,598 B1   2/2003     Chen
6,693,306 B1   2/2004     Chen et al.

FOREIGN PATENT DOCUMENTS

| EP | 0 921 577 A1 | 6/1999 |
|---|---|---|
| GB | 2 343 994 | 5/2000 |
| JP | 2-148776 | 6/1990 |
| JP | 7-30153 | 1/1995 |
| JP | 11-150298 | 6/1999 |
| JP | 2002-280618 | 9/2002 |

OTHER PUBLICATIONS

Abstract of Japanese Patent No. 2002280618, 1 page.

*Primary Examiner*—Jerome Jackson
(74) *Attorney, Agent, or Firm*—Patent Law Group LLP; Rachel V. Leiterman

(57) ABSTRACT

A light emitting device includes a layer of first conductivity type, a layer of second conductivity type, and a light emitting layer disposed between the layer of first conductivity type and the layer of second conductivity type. A via is formed in the layer of second conductivity type, down to the layer of first conductivity type. The vias may be formed by, for example, etching, ion implantation, diffusion, or selective growth of at least one layer of second conductivity type. A first contact electrically contacts the layer of first conductivity type through the via. A second contact electrically contacts the layer of second conductivity type. A ring that surrounds the light emitting layer and is electrically connected to the first contact electrically contacts the layer of first conductivity type.

13 Claims, 14 Drawing Sheets

CONTACTING SCHEME FOR LARGE AND SMALL AREA SEMICONDUCTOR LIGHT EMITTING FLIP CHIP DEVICES

CROSS REFERENCE TO RELATED APPLICATIONS

This application is a continuation of application Ser. No. 10/172,311, filed Jun. 13, 2002 and now U.S. Pat. No. 6,828,596 incorporated herein by reference.

FIELD OF THE INVENTION

This invention relates generally to light emitting diodes and more specifically to contacts for light emitting diodes.

BACKGROUND

Semiconductor light emitting devices such as light emitting diodes (LEDs) are among the most efficient light sources currently available. Material systems currently of interest in the manufacture of high brightness LEDs capable of operation across the visible spectrum include group III-V semiconductors, particularly binary, ternary, and quaternary alloys of gallium, aluminum, indium, and nitrogen, also referred to as III-nitride materials; and binary, ternary, and quaternary alloys of gallium, aluminum, indium, and phosphorus, also referred to as III-phosphide materials. Often III-nitride devices are epitaxially grown on sapphire, silicon carbide, or III-nitride substrates and III-phosphide devices are epitaxially grown on gallium arsenide by metal organic chemical vapor deposition (MOCVD) molecular beam epitaxy (MBE) or other epitaxial techniques. Often, an n-type layer (or layers) is deposited on the substrate, then an active region is deposited on the n-type layers, then a p-type layer (or layers) is deposited on the active region. The order of the layers may be reversed such that the p-type layers are adjacent to the substrate.

Some of these substrates are insulating or poorly conducting. In some instances, a window is attached to the semiconductor layers to enhance optical extraction. Devices fabricated from semiconductor crystals grown on or affixed to poorly conducting substrates must have both the positive and the negative polarity electrical contacts to the epitaxially grown semiconductor on the same side of the device. In contrast, semiconductor devices grown on conducting substrates can be fabricated such that one electrical contact is formed on the epitaxially grown material and the other electrical contact is formed on the substrate. However, devices fabricated on conducting substrates may also be designed to have both contacts on the same side of the device on which the epitaxial material is grown so as to improve light extraction from the LED chip. There are two types of devices with both the p- and n-contacts formed on the same side. In the first (also known as the flip chip), the light is extracted through the substrate or window material. In the second (also known as an epi-up structure), the light is extracted through the contacts, through the uppermost semiconductor layers of the device, or through the edges of the devices.

SUMMARY

In accordance with one embodiment of the invention, a light emitting device includes a layer of first conductivity type, a layer of second conductivity type, and a light emitting layer disposed between the layer of first conductivity type and the layer of second conductivity type. A via is formed in the layer of second conductivity type, down to the layer of first conductivity type. The vias may be formed by, for example, etching, ion implantation, diffusion, or selective growth of at least one layer of second conductivity type. A first contact electrically contacts the layer of first conductivity type through the via. A second contact electrically contacts the layer of second conductivity type. A ring that surrounds the light emitting layer and is electrically connected to the first contact electrically contacts the layer of first conductivity type.

A light emitting device according to the present invention may offer several advantages. First, since the distance over which current must laterally spread within the semiconductor is reduced, the series resistance of the device may be reduced. Second, more light may be generated and extracted from the device since the area of the active region and the area of the second contact may be larger than a device with a single first contact. Third, the invention may simplify the geometry of the interconnections between the device and the submount, enabling the use of, for example, low cost solder deposition methods.

DETAILED DESCRIPTION

In accordance with embodiments of the invention, a light emitting device such as a light emitting diode is formed with an n-contact comprising a plurality of vias. Such light emitting devices may be any suitable material system, including, for example, II–VI materials systems and III–V materials systems such as III-nitride, III-phosphide, and III-arsenide.

Figure 1:
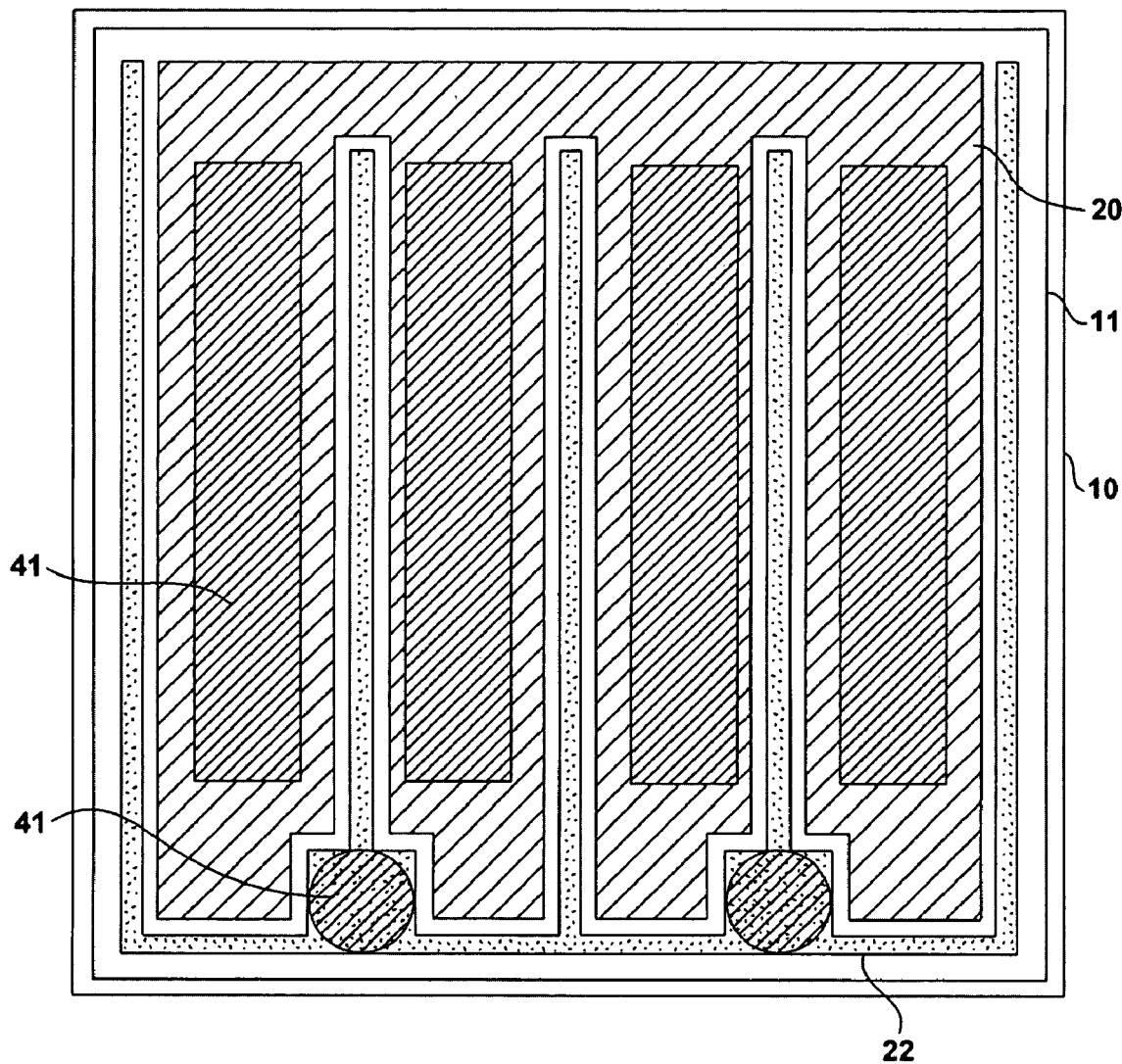
FIG. 1 is an example of a large junction light emitting device.

FIG. 1 illustrates an example of a large area III-nitride flip chip light emitting device. A large area device is a device with an area greater than or equal to about 0.2 square millimeter, while a small area device is a device with an area less than about 0.2 square millimeter. A small area device may be, for example, 0.3 mm by 0.4 mm. The device illustrated in FIG. 1 may be, for example, 1 mm on a side. The device shown in FIG. 1 is described in more detail in application Ser. No. 09/469,657, titled "III-Nitride Light-Emitting Device With Increased Light Generating Capability," filed Dec. 22, 1999 on an invention of Krames et al., and incorporated herein by reference. The device shown in FIG. 1 has a single, large n-contact and a single, large p-contact.

Because of the high resistivity of the p-type layers, III-nitride light emitting devices employ a metal layer overlying the p-type layers to provide p-side current spreading. When both contacts are formed on the same side of the device, the n-side current spreading must occur through the n-type III-nitride layers. In III-phosphide devices formed on conducting substrates, n-side current spreading may also occur through the substrate. In both III-nitride and III-phosphide devices, the distance over which current spreading within the semiconductor is required should be minimized, since requiring current spreading over large distances causes higher resistance and less uniform current density. Increased driving voltages must be applied to the devices in order to get the required current density at every point in the n-type layers. In the III-nitride device shown in FIG. 1, for example, the distance required for current spreading by the n-type layer may be kept less than about 200 microns, meaning no part of the p-contact is more than 200 microns from the nearest part of the n-contact Current spreading can be a particular problem in the case of large area devices, in which the current in the lower semiconductor layers must spread some considerable lateral distance. In order to circumvent this problem, the concept of using the current spreading fingers as shown in FIG. 1 has been proposed. However, in devices with current spreading fingers on the n-contact as shown in FIG. 1, considerable active region must be sacrificed in order to provide fingers for increased current spreading. In small area chips, i.e. devices with an area less than 0.2 square millimeter, efficient current spreading may be less of an issue than in large area chips. However, LED active region area must still be sacrificed in order to make contact to the semiconductor layer. Typically, the minimum absolute area required to make such a contact would be fixed by the minimum size to which it is possible to make electrical contact to the chip. In the case of a flip chip, the minimal manufacturable size of a solder bump would determine the minimum size of the underlying contact area. In the case of an epi-up structure, the minimum area to which wire bonds could be made reproducably would determine this minimum contact area. Therefore, as the area of LED chips decrease, the fractional area of the chip required to make the contact to the n-type semiconductor layer increases and the fractional active region area of the LED decreases.

Figure 2:
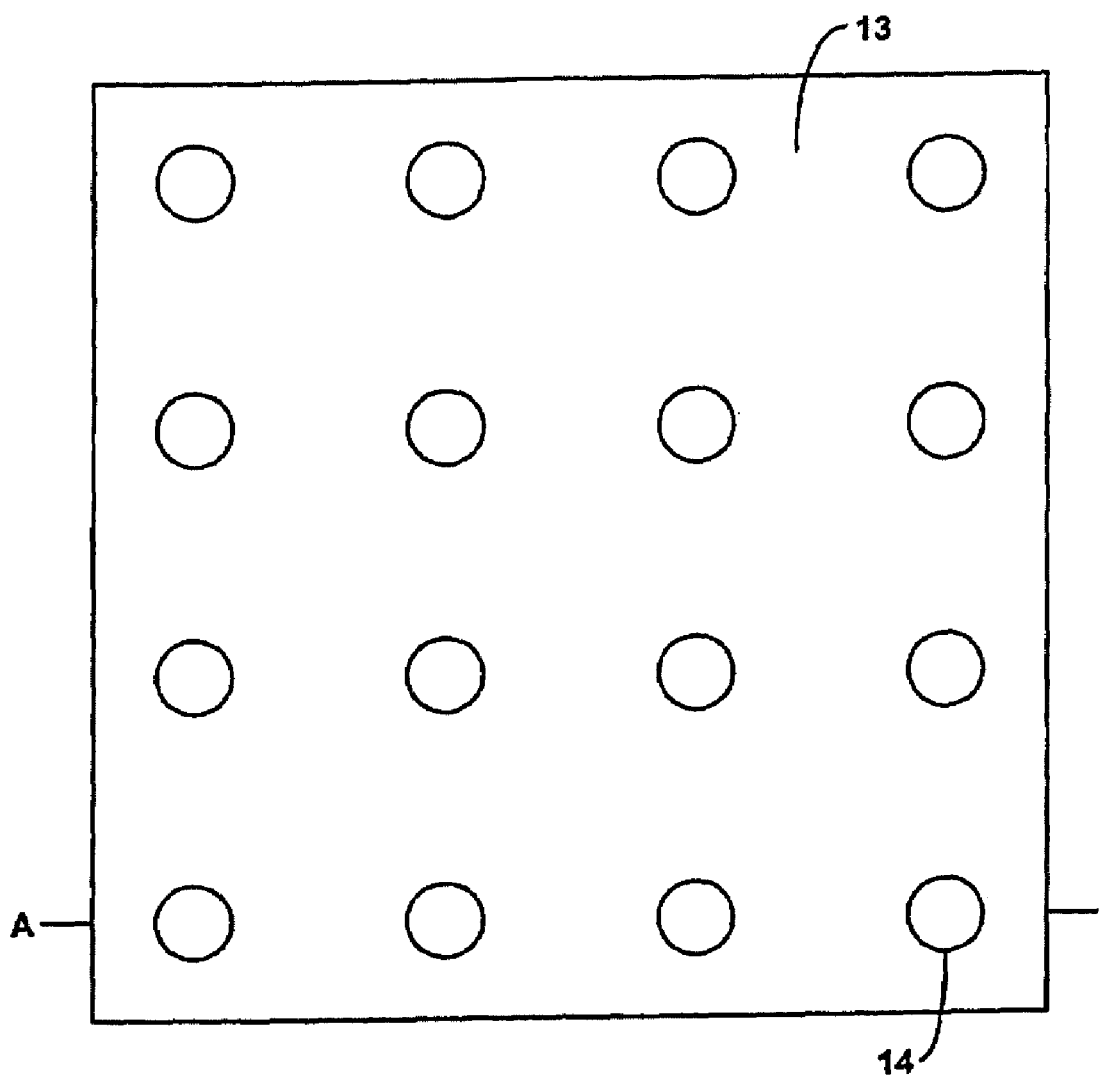
FIG. 2 is a plan view of a large junction light emitting device with vias.

FIG. 2 illustrates a plan view of an example of an LED formed in accordance with the present invention. Rather than using a single, large n-contact as shown in the device in FIG. 1, the device of FIG. 2 makes contact to the n-layer of the device through a series of vias 14 which are etched through the active region and the p-layers of the device.

Figure 3:
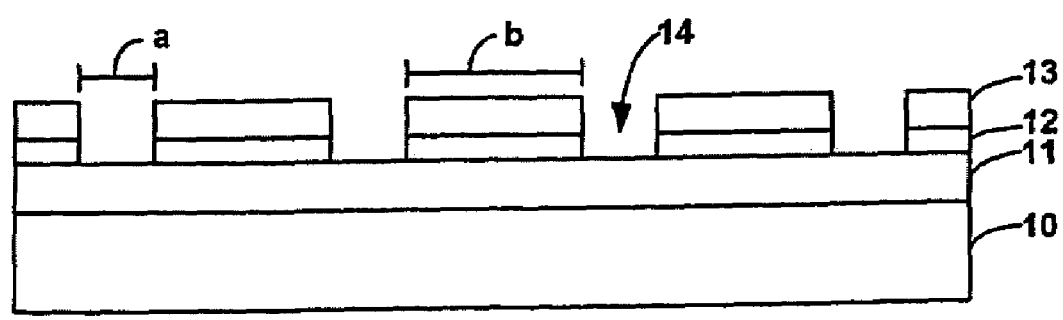
FIG. 3 is a cross sectional view of the device shown in FIG. 2 along axis A.

FIG. 3 is a cross section of the device shown in FIG. 2, taken through axis A. In FIGS. 2 and 3 only the semiconductor layers, and not metal contacts, are shown for clarity. As shown in FIG. 3, one or more n-type layers 11 are formed over a substrate 10. An active region 12 is formed over the one or more n-type layers and one or more p-type layers 13 are formed over the active region. Several vias 14 are formed in the device down to n-type layers 11 by etching away p-type layers 13 and active region 12 with, for example, a reactive ion etch; by ion implantation; by dopant diffusion; or by selective growth of active region 12 and p-type layers 13. The diameter (dimension a in FIG. 3) of the via may be, for example, between about 2 microns and about 100 microns, and is usually between about 10 microns and about 50 microns. The spacing between vias (dimension b in FIG. 3) may be, for example, about 5 microns to about 1000 microns, and is usually about 50 microns to about 200 microns. The device illustrated in FIG. 2 has a 4×4 rectangular array of vias. A rectangular array of a different size (for example, 6×6 or a 9×9) may also be used, as well as a hexagonal array, a rhombohedral array, a face-centered cubic array, an arbitrary arrangement, or any other suitable arrangement.

A p-contact is formed on what remains of p-type layers 13, and n-contacts are deposited in vias 14. The p- and n-contacts are usually selected for low optical absorption of light and low contact resistivity. For a III-nitride device, the p-contact may consist of, for example, Ag, Al, Au, Rh, Pt. A multilayer contact may include a very thin semitransparent ohmic contact in conjunction with a thick reflective layer which acts as a current spreading layer. An optional barrier layer is included between the ohmic layer and the reflective layer. One example of such a p-type multilayer contact is a gold/nickel oxide/aluminum contact. Typical thicknesses for this type of contact are 30 angstroms of gold, 100 angstroms of nickel oxide, and 1500 angstroms of aluminum. The n-contact of a III-nitride device may be, for example, Al, Ag, or a multilayer contact. A suitable n-type III-nitride multilayer contact is titanium and aluminum with typical thicknesses of 30 angstroms of titanium and 1500 angstroms of aluminum. For a III-phosphide device, the p-contact may be, for example, Au:Zn, Au:Be, Al, Pt, Pd, Rh, or Ag. The n-contact of a III-phosphide device may be, for example, Au:Te, Au:Sn, Au:Ge, Ag, Al, Pt, Rh, or Pd.

Figure 4A:
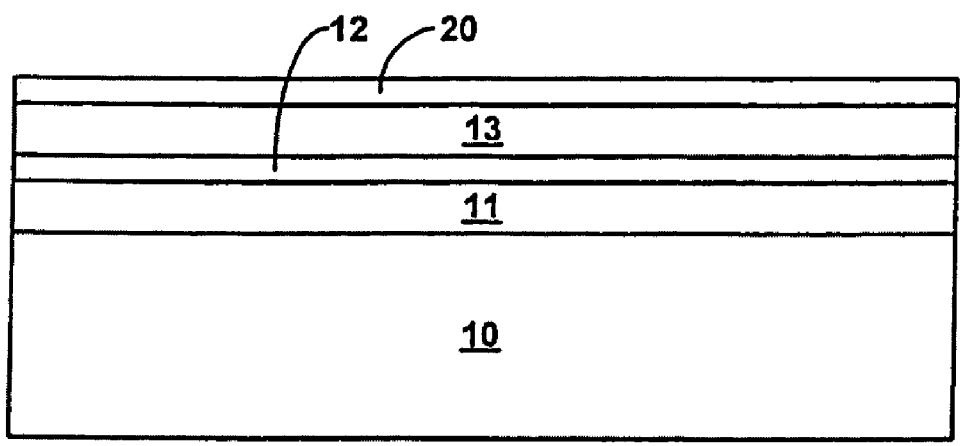
FIGS. 4A–4E illustrate an embodiment of the present invention at various stages during fabrication.

FIGS. 4A–4E illustrate an embodiment of the present invention at various stages during fabrication. In FIG. 4A, one or more n-type layers 11 are deposited epitaxially on a substrate 10. N-type layers 11 may include, for example, a buffer layer, a contact layer, an undoped crystal layer, and n-type layers of varying composition and dopant concentration. N-type layers may be deposited by, for example, MOCVD. An active region 12 is then formed on n-type layers 11. Active region 12 may include, for example, a set of quantum well layers separated by a set of barrier layers. One or more p-type layers 13 are then formed on the active region. P-type layers 13 may include, for example, an electron confining layer, a contact layer, and other p-type layers of various composition and dopant concentration. One or more p-metal layers 20 which will form the electrode or contact to p-type layers 13 is then depositeds on p-type layers 13. P-metal 20 may be a highly reflective metal such as, for example, silver. When silver is used as p-metal 20, a thin metal layer for making ohmic contact, such as nickel, is optionally deposited under p-metal 20.

Figure 4B:
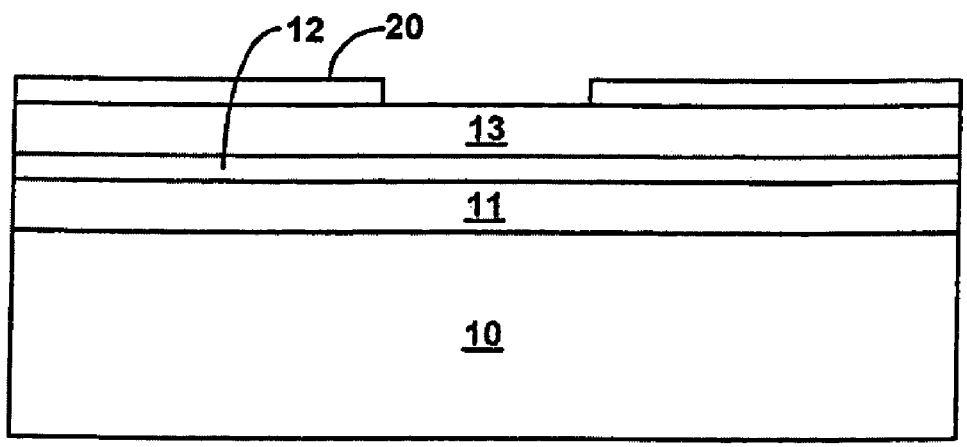

P-metal 20 is then patterned as shown in FIG. 4B, using for example photolithography along with etching, or a lift-off process. The patterning removes any p-metal 20 that will not be used as a p-contact. The patterning thus removes any p-metal 20 overlying vias 14 shown in FIGS. 2 and 3.

Figure 4C:
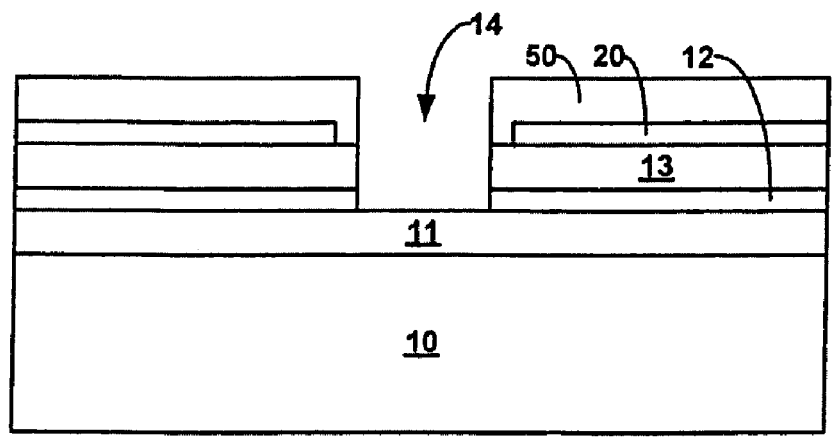

In FIG. 4C, an optional guard metal layer 50 is deposited over the remaining p-metal 20 and the exposed p-type layers 13. Guard metal layer 50 is used for example when silver is used as p-metal 20. Guard metal layer 50 prevents the silver p-metal from migrating to other parts of the device. Guard metal layer 50 is then patterned and etched in one or more etching steps to form vias 14. Rather than etching, vias 14 may be formed by selectively growing p-type layers 13 such that no p-type layer is grown where the vias are to be located. Or, vias 14 may be formed by implanting or diffusing n-type ions into the p-type region and active region located in the vias to form an n-type region in the vias, rather than etching away the p-type layer and active region in the via locations. Thus, vias 14 are not necessarily openings formed in the p-type layers 13 and the active region 12.

Figure 4D:
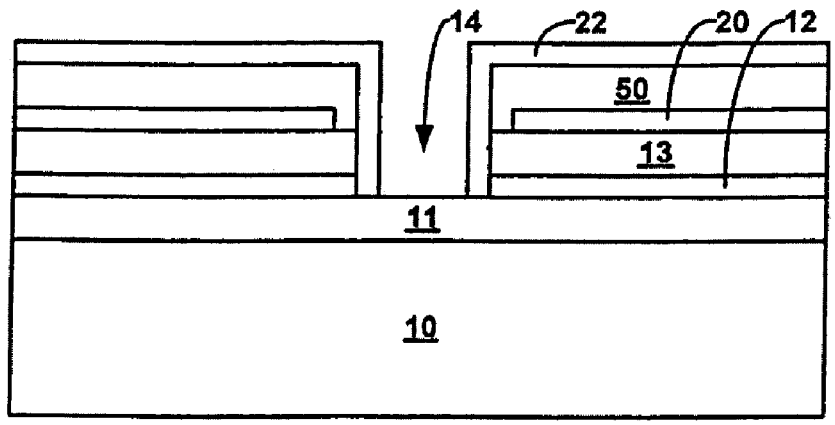

A dielectric layer 22, such as for example aluminum oxide, is deposited in FIG. 4D to electrically isolate p-metal 20 and guard metal 50 from an n-metal to be deposited in via 14. Dielectric layer 22 may be any material that electrically isolates two materials on either side of dielectric layer 22. Dielectric layer 22 is patterned to remove a portion of the dielectric material covering n-type layer 11 at the bottom of via 14. Dielectric layer 22 must have a low density of pinholes to prevent short circuiting between the p- and n-contacts. In some embodiments, dielectric layer 22 is multiple dielectric layers.

Figure 4E:
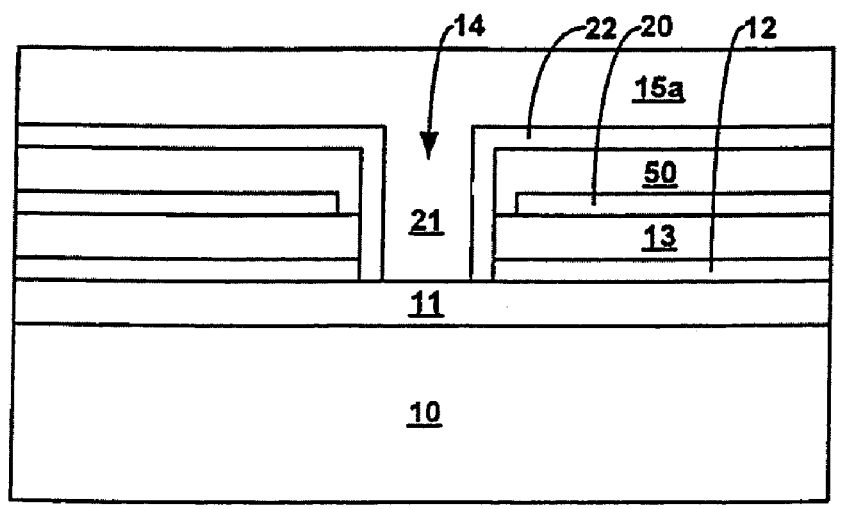

In FIG. 4E, n-metal 21 is deposited in via 14. Interconnect 15a, which connect the n-metal deposited in each via, may also be deposited at this time.

Making contact to the n-type layers of a light emitting device using an array of vias 14 as shown in FIG. 2 may offer several advantages. First, the use of vias reduces the amount of lateral current spreading required in the device by reducing the maximum distance from any point underlying the p-contact to any point underlying the n-contact. Calculations show that the current spreading resistance in the n-type layers of large area LEDs having the n-type layer contacted in an array of vias can be reduced by a factor of 10 to 20. Reduction of the device resistance also reduces the normal operating voltage of the device, which enhances the wall plug efficiency of the device. The wall plug efficiency of a device is defined as the ratio of optical watts out to electrical watts put into the device. Thus, for injection of the same current density through the active region, a device such as that shown in FIG. 2 would require less forward voltage than a device such as that shown in FIG. 1. Furthermore, the reduced distance over which current spreading occurs in the n-type semiconductor layer results in more uniform current density in the active region which leads to more uniform operation and light output of the device. In addition, less resistance means that less heat is generated in the device, which also leads to more efficient light generation through reduced junction temperature. A reduction in heat output may also simplify submount design, since less heat needs to be dissipated by the connection to the submount.

Second, when vias are used to make contact to the n-type layer instead of a single large contact as shown in FIGS. 1 and 2, the area utilization ratio of the device increases. The area utilization ratio is defined as the ratio of the p-metal area to the surface area of the side of the device on which the contacts are formed. An increase in area utilization ratio means that the device has more active region, since the active region underlies the p-metal, and therefore can generate more light. Also, an increase in area utilization ratio means an increase in the area of the highly-reflective p-contact. Thus, a greater fraction of the light incident on the contact side of the device is incident on the highly-reflective p-contact, thereby decreasing the absorption of the light which is generated within the device. For a 1 square millimeter device using vias for the n-contact, the area utilization ratio may exceed 80%, compared to 68% for a finger-contact scheme as shown in the device of FIG. 1.

Figure 5:
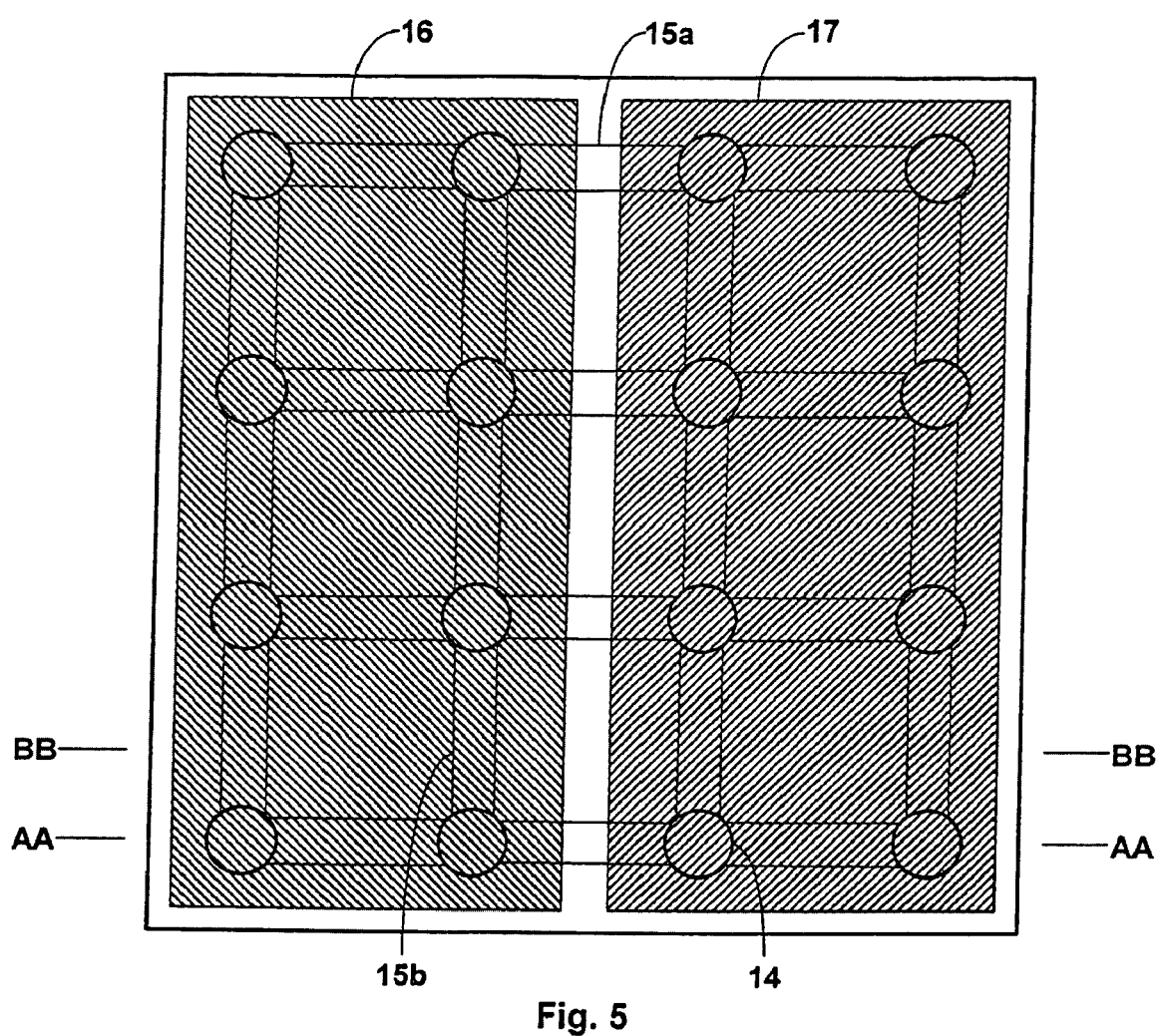
FIG. 5 is a plan view of a light emitting device with vias and solder connections.
Figure 6:
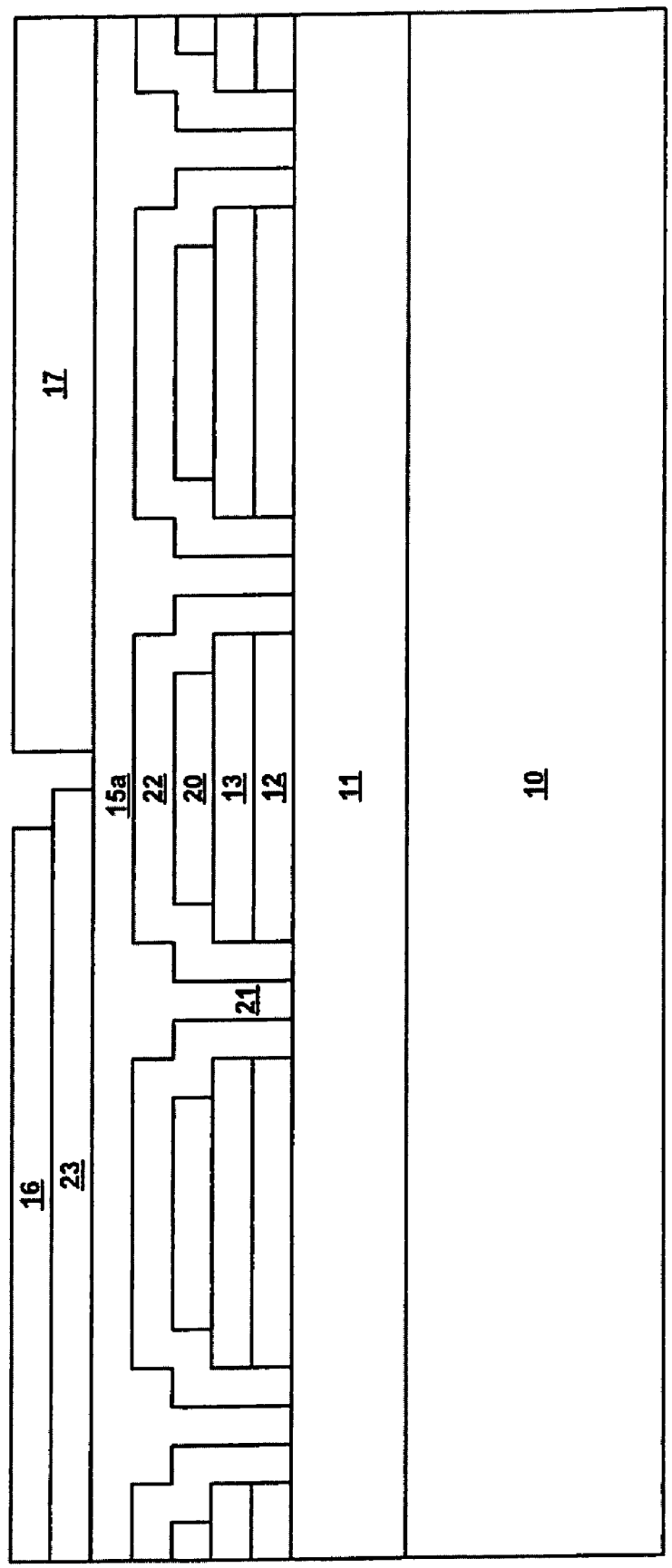
FIG. 6 is a cross sectional view of the device shown in FIG. 5 along axis AA.
Figure 7:
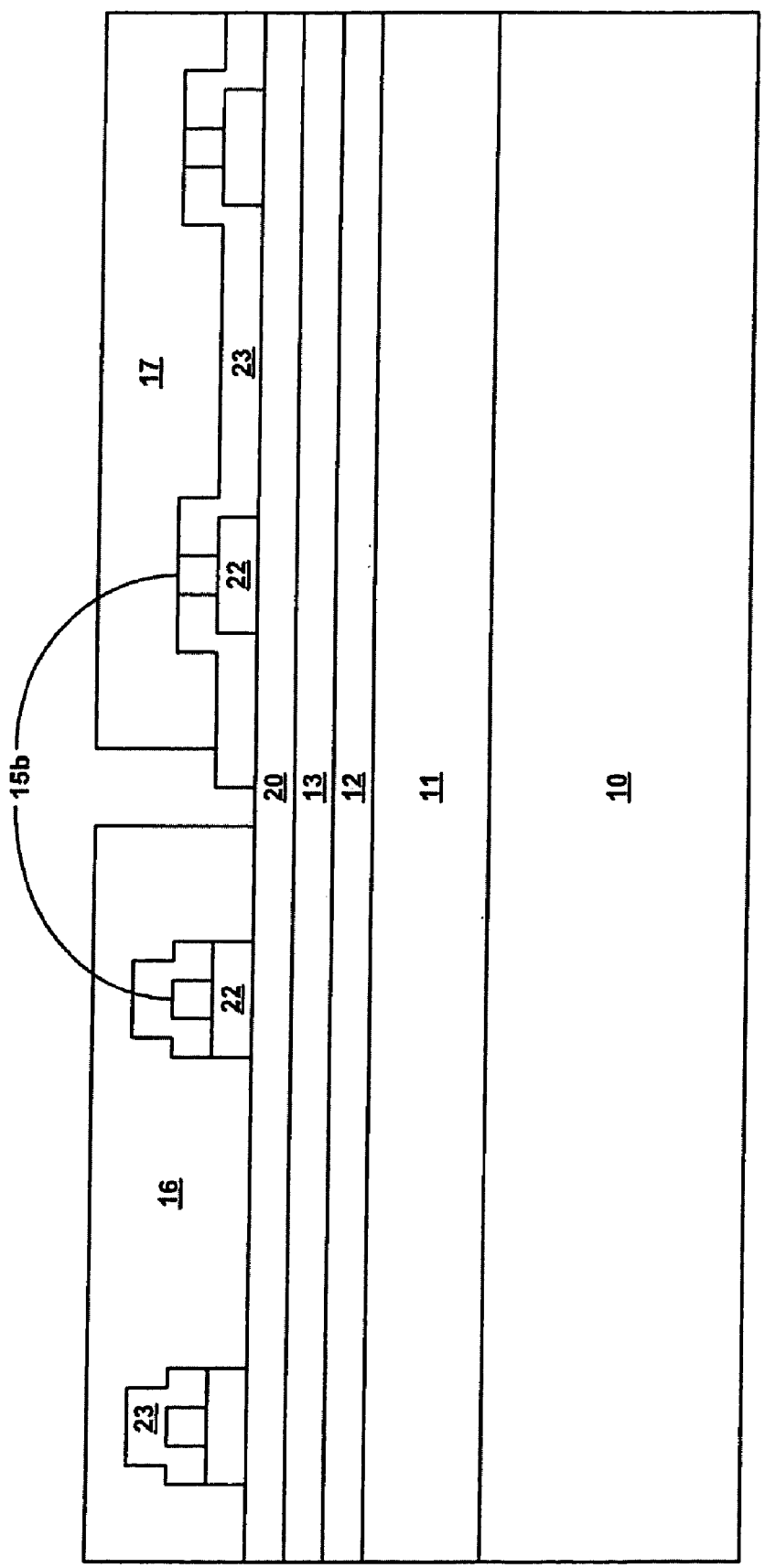
FIG. 7 is a cross sectional view of the device shown in FIG. 5 along axis BB.

Third, the use of vias instead of a large n-contact can simplify the design of the submount, by making the arrangement of the submount connections to the p-metal and n-metal arbitrary. The ability to make arbitrarily-arranged submount connections is illustrated in FIGS. 5, 6, and 7. FIG. 5 is a plan view of a large junction device (i.e. an area greater than or equal to 0.2 square millimeters) using vias. Vias 14 are interconnected by horizontal interconnections 15a and vertical interconnections 15b. Interconnections 15a and 15b may be, for example, 10 microns wide. FIG. 5 also shows a possible submount connection. Submount connection layers 16 and 17 make electrical connection between the light emitting device and the submount while providing a thermal path for heat removal during operation. Submount connection layers 16 and 17 may be solder layers, or any other type of conductive connection between the submount and the device such as elemental metals, metal alloys, semiconductor-metal alloys, thermally and electrically conductive pastes or compounds (e.g. epoxies), eutectic joints between dissimilar metals between the light emitting device and the submount (e.g. Pd—In—Pd), gold stud-bumps, or solder bumps. Submount connection 16 connects to portions of the p-metal of the device, and submount connection 17 connects to the n-metal deposited in some vias and the interconnects 15a and 15b connecting the vias.

As is shown in FIG. 5, the interconnected vias form a grid over the device. Though only the n-metal in vias 14 contact the n-type layer, interconnects 15a and 15b are electrically connected to the vias and are thus electrically connected to the n-type layers. Accordingly, both vias 14 and interconnects 15a and 15b are available as n-contacts to a submount. Unlike the n-contact shown in FIG. 1, vias 14 and interconnects 15a and 15b are not confined to a particular area on the chip. Similarly, the grid formed by vias 14 and interconnects 15a and 15b encloses an array of nine p-contact sections available as p-contacts to a submount. Like the n-contacts, the p-contact sections are not confined to a particular area on the chip. Thus, since p-contacts and n-contacts are located in many places on the chip, the submount connections are not limited by the shape and location of the p- and n-contacts.

FIG. 6 is a cross section of the device shown in FIG. 5, taken along axis AA. The n-type layers 11, active region 12, p-type layers 13, and p-metal 20 are formed for example as described above in reference to FIGS. 4A–4E. Optional guard layer 50 is omitted for clarity. The vias are isolated from the p-type layers and p-metal contacts by dielectric layer 22. An n-metal may then be deposited over the entire chip and patterned to form n-contacts 21 in vias 14 and interconnects 15a and 15b. A horizontal interconnect 15a is shown in FIG. 6. A second dielectric layer 23 is then deposited over the chip. The second dielectric layer 23 is patterned to create a first set of openings aligned with p-metal regions 20 on the side of the device underlying submount connection 16, and a second set of openings aligned with vias 14 and interconnects 15a and 15b on the side of the device underlying submount connection 17. Since submount connection 16 is the p-contact to the submount, dielectric layer 23 isolates submount connection 16 from interconnects 15a and 15b. Since submount connection 17 is the n-contact to the submount, dielectric layer 23 is removed from the interconnects and vias underlying layer 17 such that submount connection 17 can make electrical contact with vias 14 and interconnects 15a and 15b.

FIG. 7 is a cross section of the device shown in FIG. 5, taken along axis BB. Submount connection 16 is to make contact to p-metal 20, thus in the area directly underlying submount connection 16, all of dielectric layer 23 is removed, except the portion covering vertical interconnects 15b. Submount connection 17 is to make contact to the n-metal and interconnects, thus in the area underlying submount connection 17 dielectric layer 23 is removed only from the top surface of vertical interconnects 15b. P-metal layer 20 is thus isolated from submount connection 17 by dielectric layer 23. Submount connections 16 and 17 need not be deposited as shown in FIG. 5. Other configurations are possible by properly patterning dielectric layer 23.

The ability to make arbitrary connections to the submount provides several advantages. Large conductive submount connections as shown in FIG. 5 may be easier and cheaper to deposit on the device than one or multiple smaller submount connections. For example, in the device shown in FIG. 5, solder layers can easily by deposited for submount connections 16 and 17 by screen or stencil printing. In contrast, the device shown in FIG. 1 requires solder bumps in order to contact the n-electrode. Solder bumps are costly and require tight manufacturing tolerances. Screen printing solder is comparatively cheaper and simpler. Also, large conductive submount connections dissipate more heat from the LED flip chip than smaller connections. As is known in the art, cooler light emitting devices typically generate more light than warmer devices and offer improved operation lifetime.

Figure 8:
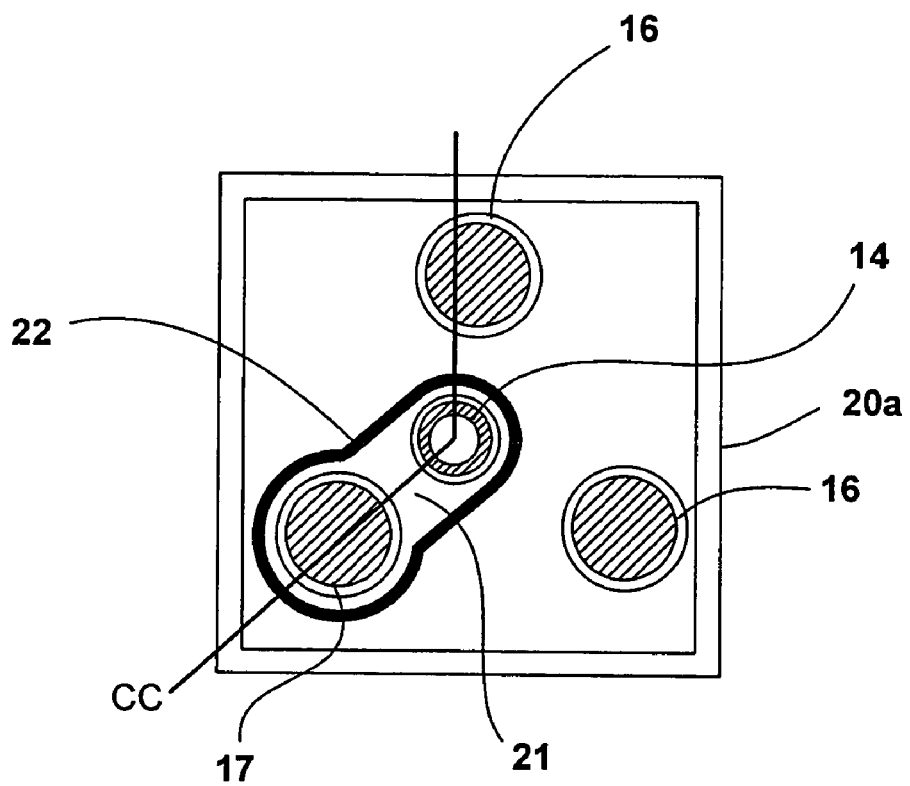
FIG. 8 is a plan view of a small junction light emitting device with vias.
Figure 9:
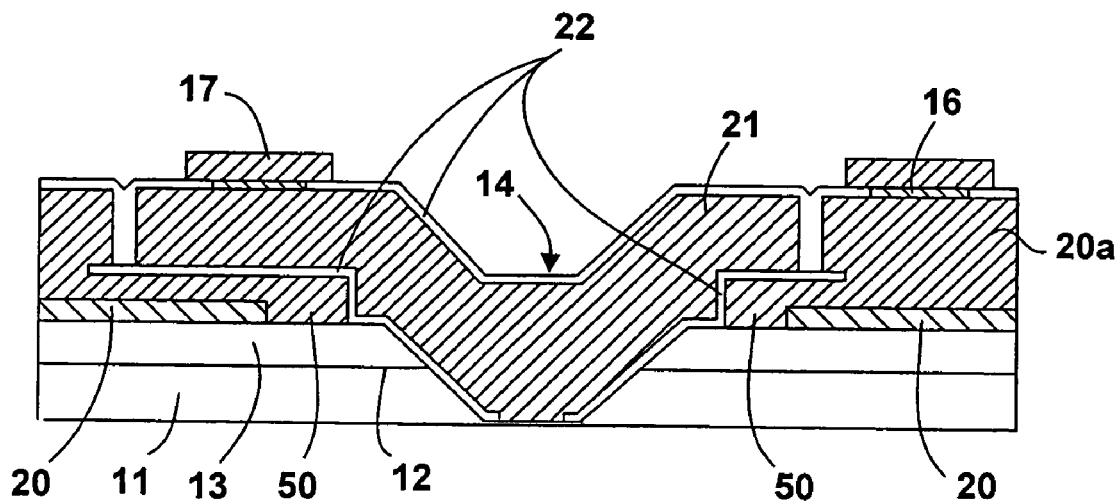
FIG. 9 is a cross sectional view of the device shown in FIG. 8 along axis CC.

FIG. 8 is a plan view of a small junction device (i.e. an area less than one square millimeter) using vias. FIG. 9 is a cross section of the device shown in FIG. 8, taken along axis CC. The device shown in FIGS. 8 and 9 has a single via 14 etched down to n-type layer 11. An n-contact 21 is deposited in via 14. N-via 14 is located at the center of the device to provided from improved uniformity of current and light emission. A highly reflective p-contact 20 is deposited on p-type layer 13. An optional guard metal layer 50 covers reflective p-contact 20, and a thick p-metal layer 20a is deposited over guard metal layer 50. N-contact 21 is separated from the three p-metal layers 20, 50, and 20a by one or more dielectric layers 22. A p-submount connection 16 connects to p-metal layer 20a and an n-submount connection 17 connects to n-metal layer 21, for connecting the device to a submount.

As illustrated in FIG. 8, the device is connected to a submount by three submount connections, two p-submount connections 16 and one n-submount connection 17. N-submount connection 17 may be located anywhere within n-contact region 21 (surrounded by insulating layer 22) and need not be located directly over via 14. Similarly, p-submount connections 16 may be located anywhere on p-metal layer 20a. As a result, the connection of the device to a submount is not limited by the shape or placement of p-contact 20a and n-contact 21.

Figure 14:
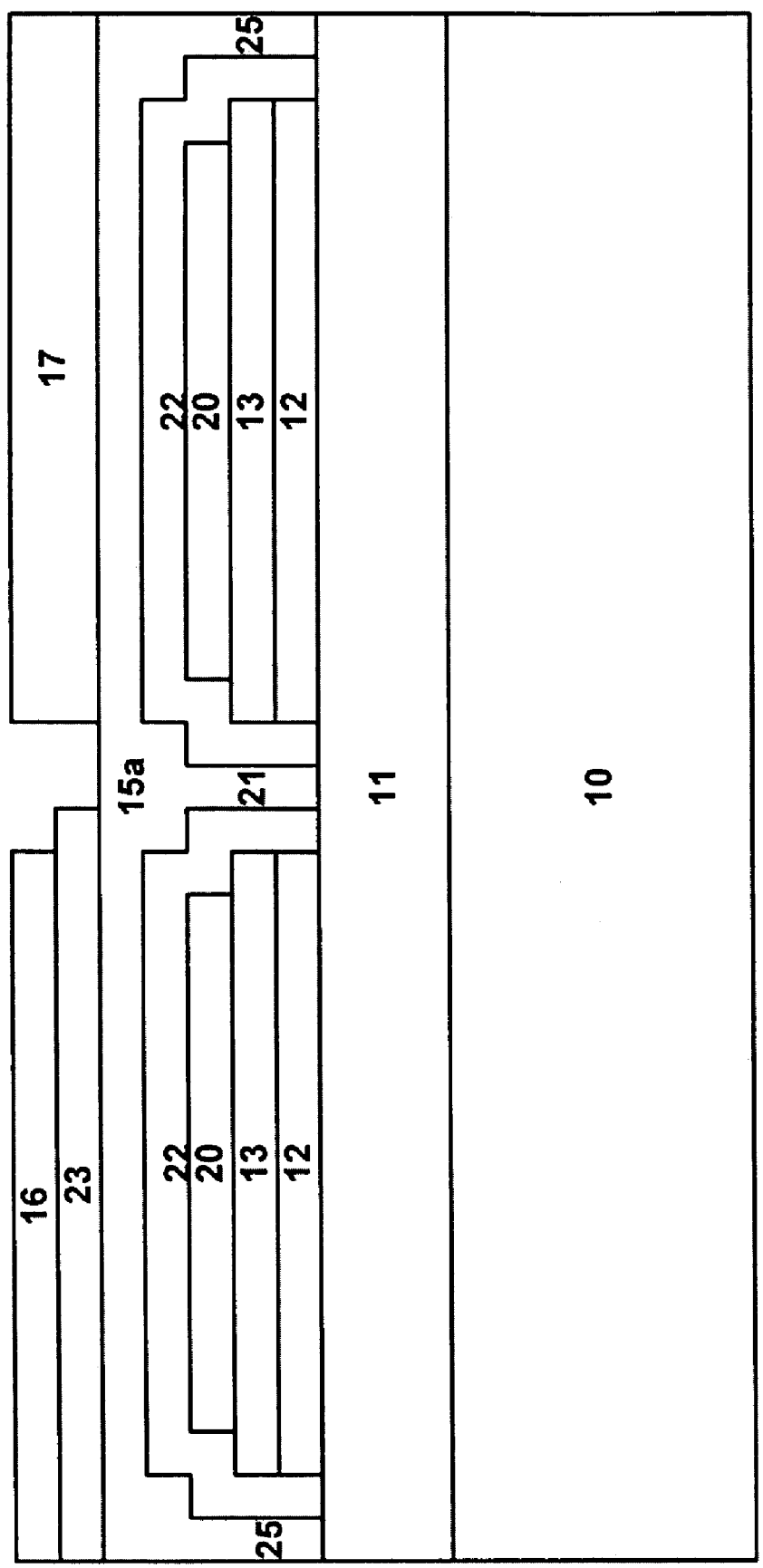
FIG. 14 is a cross sectional view of an alternative embodiment of a small junction light emitting device.
Figure 15:
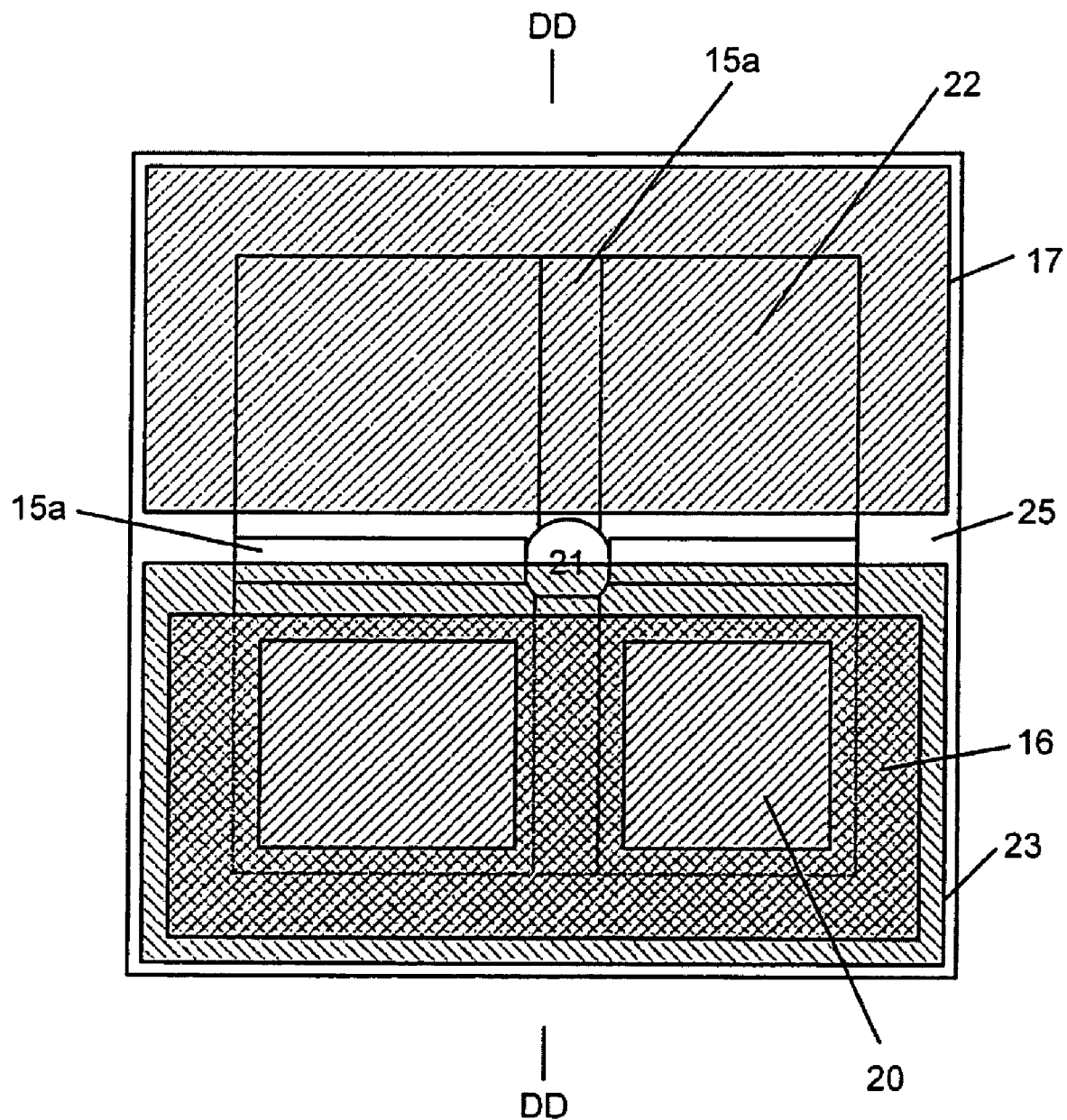
FIG. 15 is a plan view of an alternative embodiment of a small junction light emitting device.

In large or small junction devices, vias may be used in conjunction with larger contacts. FIG. 15 is a plan view of a small junction device. FIG. 14 is a cross section along axis DD of the device shown in FIG. 15. As illustrated in FIG. 15, a device may include one or more vias 21 together with a continuous n-contact ring 25 surrounding the active region. FIG. 14 illustrates that via 21 and ring 25 are electrically connected by interconnect 15a. Ring 25 reduces the distance current must spread laterally and hence reduces the series resistance of the device. The device illustrated in FIGS. 14 and 15 shows a small junction device with a single via. Ring 25 from FIGS. 14 and 15 may also be used in large junction devices with more than one via 21.

Although the examples above describe the interconnects between the light emitting device die and the submount as being solder, any suitable interconnect may be used. For example, the interconnects may be elemental metals, metal alloys, semiconductor-metal alloys, solders, thermally and electrically conductive pastes or compounds such as epoxy, eutectic joints such as Pd—In—Pd, Au stud bumps, or solder bumps.

Figure 10:
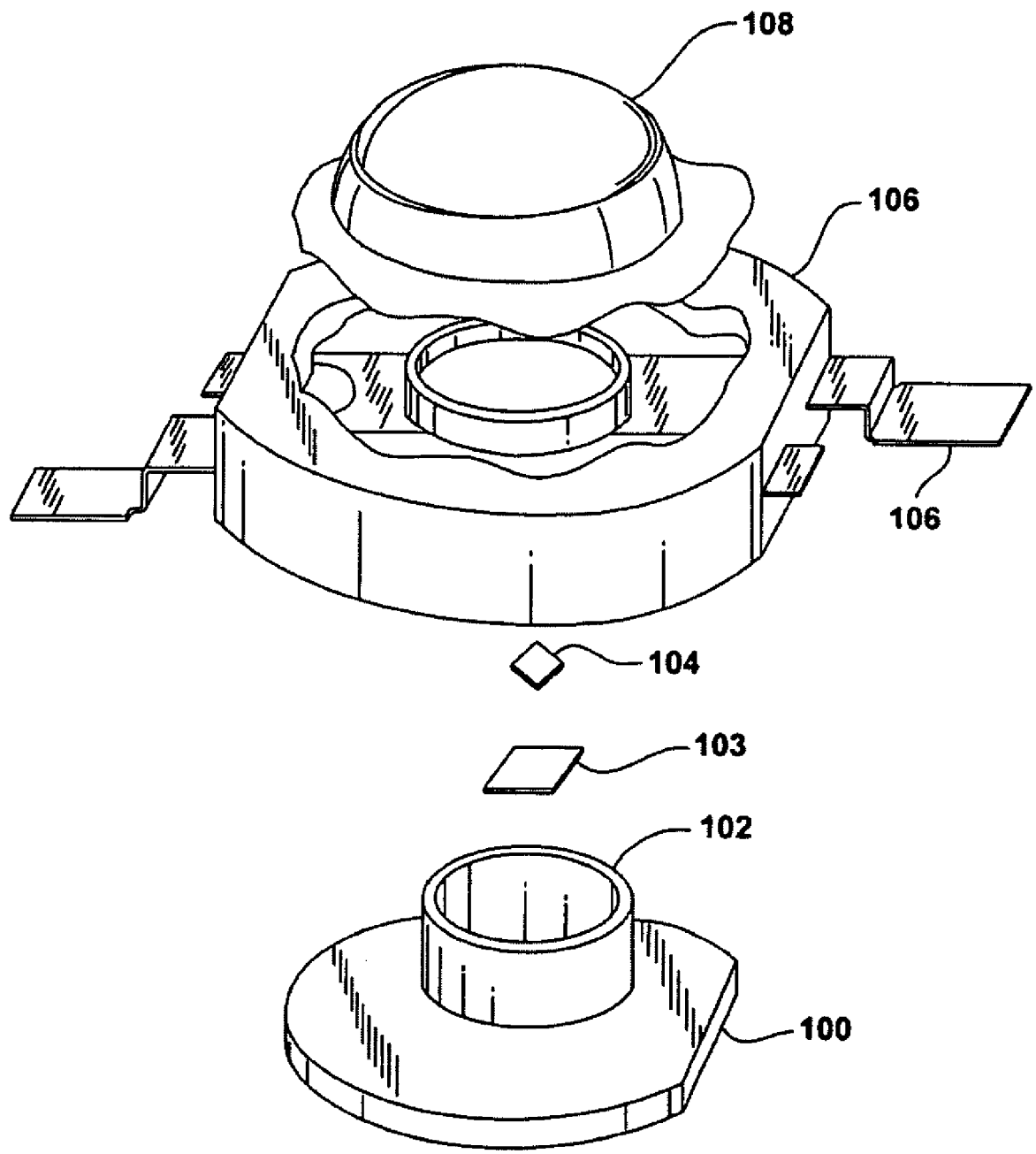
FIG. 10 is an exploded view of a light emitting device incorporated into a package.

FIG. 10 is an exploded view of a packaged light emitting device. A heat-sinking slug 100 is placed into an insert-molded leadframe 106. The insert-molded leadframe 106 is, for example, a filled plastic material molded around a metal frame that provides an electrical path. Slug 100 may include an optional reflector cup 102. The light emitting device die 104, which may be any of the devices described herein, is mounted directly or indirectly via a thermally conducting submount 103 to slug 100. An optical lens 108 may be added.

Figure 12:
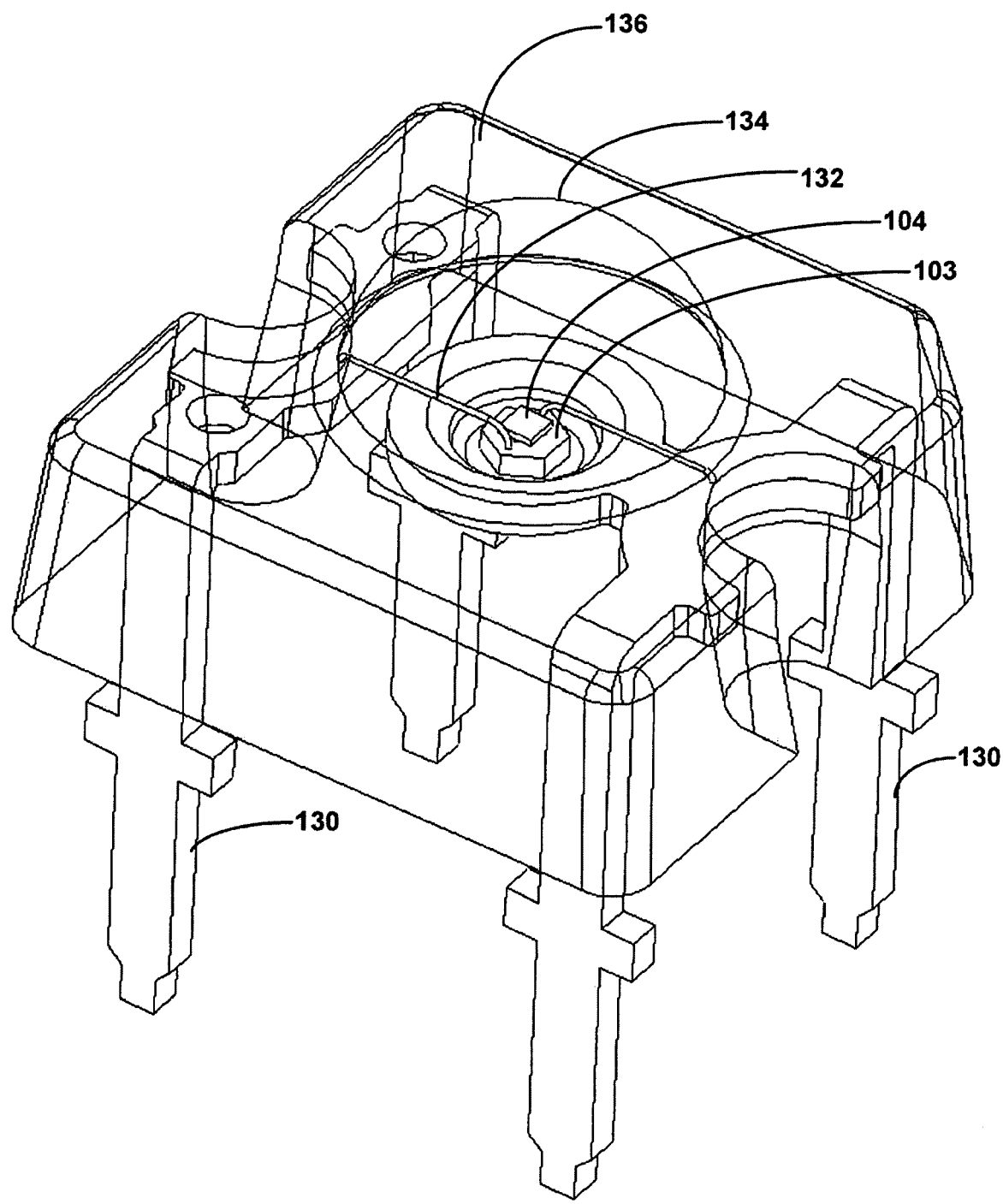
FIG. 12 illustrates a light emitting device incorporated into a package.

FIG. 12 illustrates an alternative embodiment of a packaged light emitting device. Light emitting device 104, which may be any of the devices described herein, is mounted on and electrically connected to a submount 103, which is placed in a housing 136. Electrical leads 132 connect the positive and negative terminals of submount 103 to the positive and negative terminals 130 of the package. A lens 134 may cover light emitting device 104. Lens 134 and housing 136 may be formed of, for example, transparent epoxy.

Figure 11:
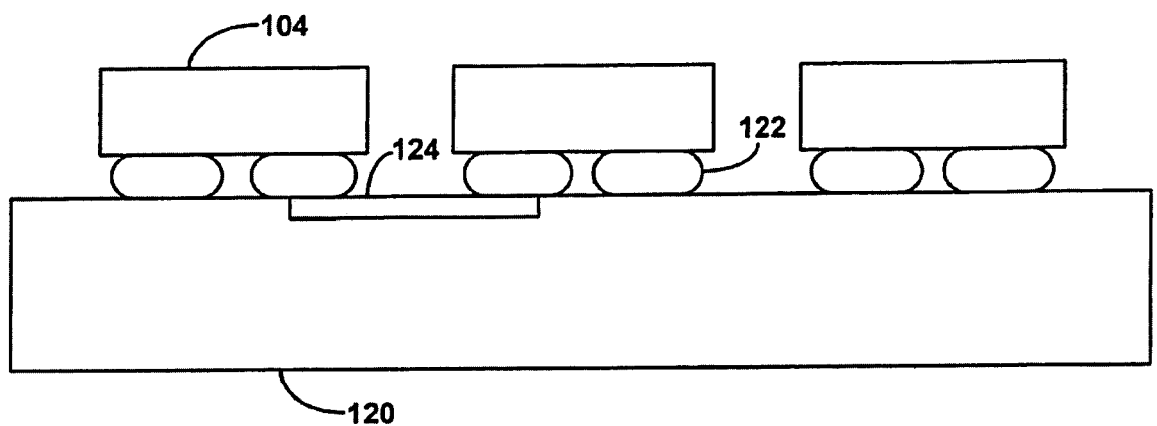
FIG. 11 is a cross sectional view of multiple light emitting devices mounted on a board.

FIG. 11 illustrates a cross sectional view of multiple LEDs mounted on a board. LEDs 104, which may be any of the devices described herein, are connected to a board 120 by interconnections 122. Interconnections 122 may be, for example, solder. Traces 124 on board 120 electrically connect LEDs 104.

Figure 13:
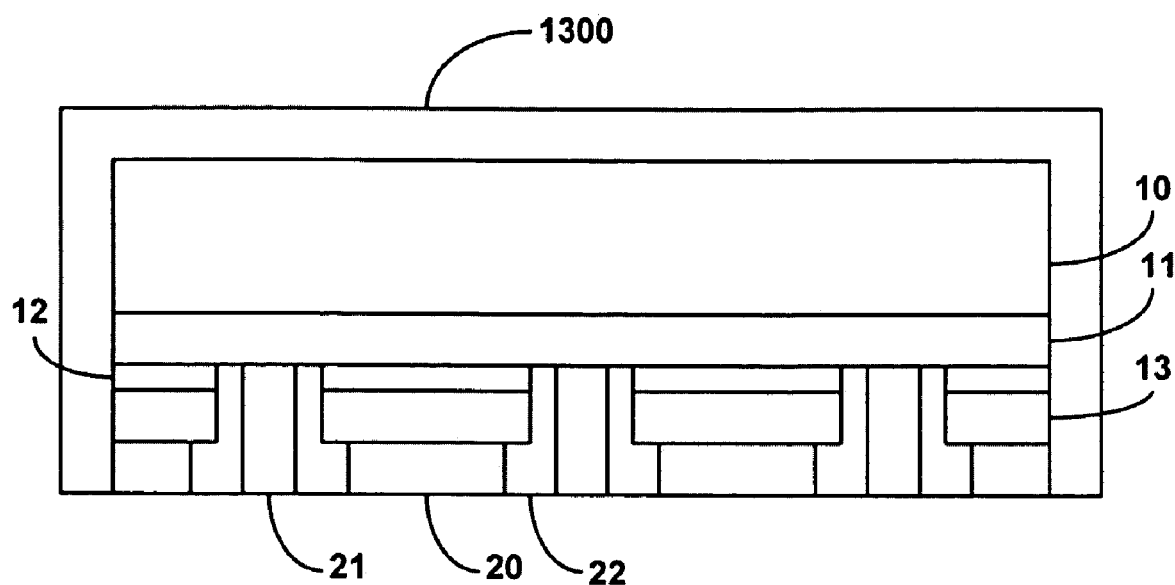
FIG. 13 illustrates a light emitting device with a with a wavelength converting material.

FIG. 13 illustrates a cross sectional view of an embodiment of the invention which includes a wavelength converting layer 1300. Wavelength-converting layer 1300 may be a fluorescent material such as a phosphor; Wavelength-converting layer 1300 absorbs light emitted from active region 12 and converts the wavelength of that light. The conversion efficiency of a wavelength-converting material such as phosphor in a device such as that shown in FIG. 13 depends on the reflectivity of contacts 20 and 21. Wavelength-converting layer 1300 emits light isotropically, hence a large fraction of the wavelength-converted light is incident on contacts 20 and 21. Also, light undergoes optical scattering when exiting wavelength-converting layer 1300, again directing a large fraction of the wavelength-converted light to contacts 20 and 21. Thus, the higher the overall reflectivity of contacts 20 and 21, the greater the fraction of light that exits the device.

The overall reflectivity of a device may be expressed as an area weighted reflectivity. The area weighted reflectivity is the sum of the reflectivity of each contact multiplied by the percentage of the area of the device covered by that contact. A device with a single large n-contact may have, for example, a silver p-contact (92% reflectivity) that covers 50% of the area of the device and an aluminum n-contact (82% reflectivity) that covers 20% of the area of the device. Such a device would have an area weighted reflectivity of 0.92*0.5+0.82*0.2=0.62. In contrast, a device with multiple n-contacts formed in vias may have a silver p-contact that covers 80% of the device and multiple aluminum n-contacts that cover 2% of the device, for an area weighted reflectivity of 0.92*0.8+0.82*0.02=0.75. Any area weighted reflectivity over 0.65 may increase the conversion efficiency of a device including a wavelength converting layer.

Although the present invention is described in connection with certain specific embodiments for instructional purposes, the present invention is not limited thereto. The depictions of various structures in the various diagrams are illustrative. For example, the invention is not limited to III-nitride or III-phosphide devices, and can be used with any device where both the p- and the n-contacts are formed on the same side of the device. Various modifications, adaptations, and combinations of various features of the described embodiments can be practiced without departing from the scope of the invention as defined in the following claims.

We claim:

1. A light emitting device comprising:
a layer of first conductivity type;
a layer of second conductivity type;
a light emitting layer disposed between the layer of first conductivity type and the layer of second conductivity type;
a via formed in the layer of second conductivity type, the via extending to the layer of first conductivity type;
a first contact electrically contacting the layer of first conductivity type through the via;
a second contact electrically contacting the layer of second conductivity type;
a submount interconnect electrically contacting the first contact, wherein at least a portion of the submount interconnect overlies the second contact; and
a ring electrically contacting the layer of first conductivity type, wherein the ring surrounds the light emitting layer and is electrically connected to the first contact.

2. The light emitting device of claim 1 further comprising an insulating layer interposing the submount interconnect and the second contact.

3. The light emitting device of claim 1 wherein the submount interconnect comprises solder.

4. The light emitting device of claim 1 further comprising:
a submount connected to the submount interconnect;
a leadframe connected to the submount; and
a lens underlying the submount.

5. The light emitting device of claim 4 wherein the leadframe comprises:
a first polarity lead comprising two legs; and
a second polarity lead comprising two legs.

6. The light emitting device of claim 4 further comprising:
a body overlying the submount, wherein the body and the lens comprise transparent epoxy.

7. The light emitting device of claim 1 further comprising:
a board connected to the submount interconnect, wherein the board comprises a trace coupled to the submount interconnect.

8. The light emitting device of claim 1 wherein the device has an area less than about 0.2 square millimeter.

9. The light emitting device of claim 1 wherein the layer of first conductivity type and the layer of second conductivity type comprise gallium and nitrogen.

10. The light emitting device of claim 1 wherein the layer of first conductivity type and the layer of second conductivity type comprise aluminum and phosphorus.

11. The light emitting device of claim 1 wherein the via has a width ranging from about 2 µm to about 100 µm.

12. The light emitting device of claim 1 wherein the via has a width ranging from about 10 µm to about 50 µm.

13. The light emitting device of claim 1 flirter comprising a substrate, wherein the layer of first conductivity type overlies the substrate, the light emitting layer overlies the layer of first conductivity type, and the layer of second conductivity type overlies the light emitting layer.

* * * * *

UNITED STATES PATENT AND TRADEMARK OFFICE
CERTIFICATE OF CORRECTION

PATENT NO. : 7,095,061 B2
APPLICATION NO. : 10/961239
DATED : August 22, 2006
INVENTOR(S) : Daniel A. Steigerwald, Jerome C. Bhat and Michael J. Ludowise It is certified that error appears in the above-identified patent and that said Letters Patent is hereby corrected as shown below:

Claim 13, column 10, line 30: Cancel "flirter" and substitute --further--.

Signed and Sealed this

Twenty-fourth Day of April, 2007

JON W. DUDAS
*Director of the United States Patent and Trademark Office*